US006051502A

United States Patent [19]
Frankamp et al.

[11] Patent Number: 6,051,502
[45] Date of Patent: Apr. 18, 2000

[54] METHODS OF FORMING CONDUCTIVE COMPONENTS AND METHODS OF FORMING CONDUCTIVE LINES

[75] Inventors: Harlan H. Frankamp, Meridian; Guy T. Blalock, Boise, both of Id.

[73] Assignee: Micron Technology, Inc., Boise, Id.

[21] Appl. No.: 08/953,910

[22] Filed: Oct. 20, 1997

[51] Int. Cl.[7] .................. H01L 21/311; H01L 21/302
[52] U.S. Cl. .................. 438/696; 438/720; 438/725; 438/733
[58] Field of Search .................. 438/696, 720, 438/733, 725

[56] References Cited

U.S. PATENT DOCUMENTS

| | | | |
|---|---|---|---|
| 4,992,137 | 2/1991 | Cathey et al. . | |
| 5,228,950 | 7/1993 | Webb et al. | 156/643 |
| 5,231,051 | 7/1993 | Baldi et al. | 438/743 |
| 5,272,117 | 12/1993 | Roth et al. | 437/228 |
| 5,314,578 | 5/1994 | Cathey | 438/695 |
| 5,316,980 | 5/1994 | Takeshiro | 438/697 |
| 5,407,862 | 4/1995 | Miyamoto | 437/192 |
| 5,413,670 | 5/1995 | Langan et al. . | |
| 5,419,805 | 5/1995 | Jolly | 437/200 |
| 5,798,303 | 8/1998 | Clampitt | 438/696 |

FOREIGN PATENT DOCUMENTS 0 662 705  7/1995  European Pat. Off. .

OTHER PUBLICATIONS

Abstract: 94–014129, "Natural Poly: Vitamin Concentrate for Human or Animal Food Supplement", 1992, 1 pg.

Abstract: 201, "After Corrosion Treatment in Aluminum Alloy Reactive Ion Etching", vol. 83, No. 1 of Extended Abstracts, May 1983, p. 327.

Baklanov, M., "Protective Films Formed by RIE of Co and Ti Silicides and Ways of their Removal", Proceedings of the 3rd Internatl. Symposium on Ultra Clean Processing of Silicon Surfaces, Sep. 1996, pp. 171–174.

Wolf, Anisotropic Etching and Control of Edge Profile, Dry Etching for VLSI Fabrication, vol. 1, pp. 551–555, no date.

Chia–Cheng Cheng, et al., A Downstream Plasma Process for Post–Etch Residue Cleaning, Semiconductor International, pp. 185–188 (Jul., 1995).

S. Jimbo, et al., Resist and Sidewall Film Removal After Al Reactive Ion Etching (RIE), Jpn. J. Appl. Phys. vol. 32 (Jun. 1993).

"Metal Etch System," Product Builletin, Tegal Corporation, 1995.

*Primary Examiner*—Steven Bos
*Attorney, Agent, or Firm*—Wells, St. John, Roberts, Gregory & Matkin, P.S.

[57] ABSTRACT

The invention encompasses methods of forming conductive components and methods of forming conductive lines. In one aspect, the invention includes a method of forming a conductive component comprising: a) anisotropically etching a conductive material into a conductive component shape having at least one sidewall, and forming an etch blocking layer over the sidewall during the anisotropic etching; and b) removing the etch blocking layer with an etchant comprising fluorine and a noble element. In another aspect, the invention includes a method of forming a conductive line comprising: a) forming a layer of conductive material; b) forming a masking layer over a portion of the layer of conductive material in the shape of a conductive line; c) anisotropically etching the conductive material with the masking layer in place to form a conductive line beneath the masking layer, the conductive line having sidewalls, a blocking layer forming over the sidewalls during the anisotropic etching; and d) removing the blocking layer with an etchant comprising fluorine and a noble element.

27 Claims, 5 Drawing Sheets

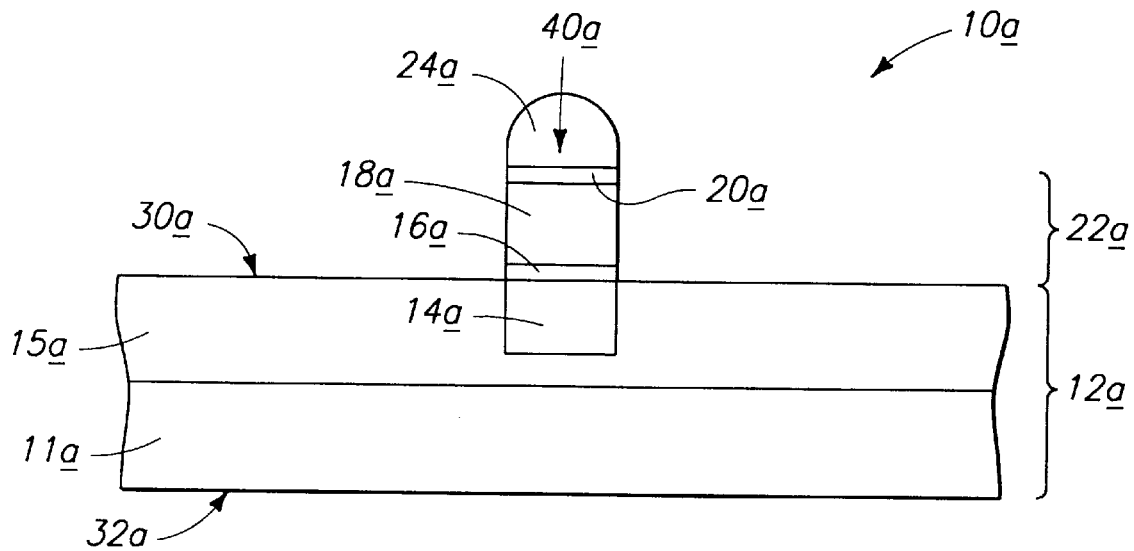
$F_{IG}$ $7$
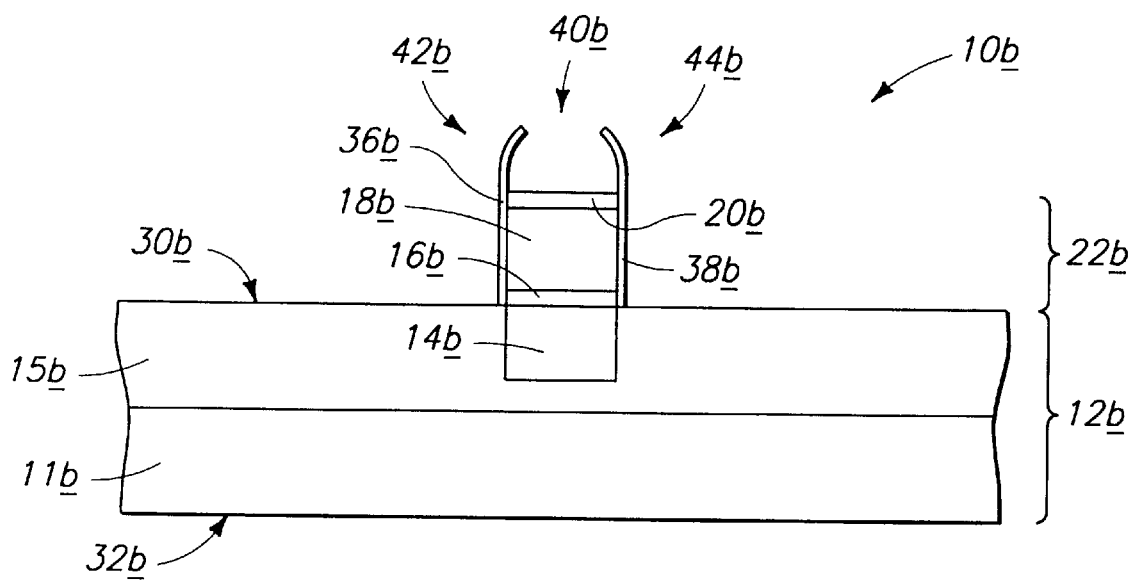
$F_{IG}$ $8$

METHODS OF FORMING CONDUCTIVE COMPONENTS AND METHODS OF FORMING CONDUCTIVE LINES

TECHNICAL FIELD

The invention pertains to methods of forming conductive components, such as conductive lines.

BACKGROUND OF THE INVENTION

Anisotropic etching is commonly utilized during the fabrication of conductive components for semiconductive circuitry. A prior art process is of anisotropic etching is described with reference to FIGS. 1–4. Referring to FIG. 1, a semiconductor wafer fragment 10 is illustrated at a preliminary step of an anisotropic etching process. Wafer fragment 10 comprises a substrate 12. Substrate 12 comprises a semiconductive material layer 11 and an insulative material layer 15 formed over the semiconductive layer. Semiconductive layer 11 can comprise, for example, monocrystalline silicon lightly doped with a p-type dopant. Insulative layer 15 can comprise, for example, borophosphosilicate glass (BPSG). Substrate 12 comprises a frontside surface 30 and a backside surface 32.

To aid in interpretation of the claims that follow, the term "semiconductor substrate" is defined to mean any construction comprising semiconductive material, including, but not limited to, bulk semiconductive materials such as a semiconductive wafer (either alone or in assemblies comprising other materials thereon) and semiconductive material layers (either alone or in assemblies comprising other materials). The term "substrate" refers to any supporting structure, including, but not limited to, the semiconductive substrates described above.

A tungsten plug 14 is formed within insulative layer 15. Tungsten plug 14 can connect to electrical components (not shown) which comprise integrated circuitry associated with substrate 12. A titanium layer 16 is formed over insulative layer 15 and in contact with tungsten plug 14. An aluminum-copper alloy layer 18 is formed above titanium layer 16, and a titanium nitride layer 20 is formed above layer 18. Together, layers 16, 18 and 20 comprise a composite conductive layer 22. A patterned masking layer 24 is formed over a portion of composite conductive layer 22. Masking layer 24 can comprise photoresist. Masking layer 24 is in a shape of a conductive component which is ultimately to be formed from composite conductive layer 22. For instance, masking layer 24 can be patterned into a shape of a conductive line. Patterned masking layer 24 comprises opposing sidewalls 26 and 28.

Referring to FIG. 2, composite conductive layer 22 is anisotropically etched. At the processing step shown in FIG. 2, composite conductive layer 22 has been partially anisotropically etched to a point at which the etching has proceeded partially through aluminum-copper alloy layer 18. Etching can occur in a reactor having a first powered electrode (not shown) in electrical connection with frontside surface 30, and a second powered electrode (not shown) in electrical connection with backside surface 32. The reactor can be a LAM9600 reactor, in which case the first electrode can be an inductively coupled electrode at 500 watts and the second electrode can be at 250 watts. The wattage is different for different reactors. For instance, in an AME DPS reactor, the first electrode can be at 1500 watts and the second electrode can be at 500 watts.

The anisotropic etch creates a conductive component 34 having sidewalls coextensive with sidewalls 26 and 28 of patterned masking layer 24. As the anisotropic etching proceeds, blocking layers 36 and 38 are formed adjacent sidewalls 26 and 28, and along the sidewalls of the electrical component. Blocking layers 36 and 38 can comprise organic materials, such as carbon-chlorine polymers, as well as inorganic materials. Blocking layers 36 and 38 protect sidewalls of component 34 from being etched and thereby enhance anisotropy of the etch of composite conductive layer 22.

Referring to FIG. 3, the anisotropic etch described with reference to FIG. 2 has completely etched through composite conductive layer 22. Blocking layers 36 and 38 now extend to frontside surface 30 of substrate 12.

Referring to FIG. 4, masking layer 24 (shown in FIG. 3) is removed to leave a conductive component shape 40 of remaining composite component layer 22. Blocking layers 36 and 38 are adjacent conductive component shape 40. Blocking layers 36 and 38 comprise extensions 42 and 44 extending above conductive component 40 and laterally adjacent where masking layer 24 (shown in FIG. 3) was before its removal.

Referring to FIG. 5, blocking layers 36 (shown in FIG. 4) and 38 (shown in FIG. 4) are removed from adjacent conductive component 40. One method of removal of such blocking layers is to utilize a bath of organic solutions to strip layers 36 and 38 from adjacent conductive component 40. Such method is undesirable as the organic solutions are environmentally hazardous and create flammable fumes. An alternative technique for removing blocking layers 36 and 38 is to utilize a phosphoric acid strip. However the phosphoric acid will undesirably etch the aluminum of alloy layer 18.

It would be desirable to develop alternative methods for removing blocking layers from adjacent a conductive component after anisotropically etching to form the conductive component.

SUMMARY OF THE INVENTION

In one aspect, the invention encompasses a method of forming a conductive component. The conductive material is anisotropically etched into a conductive component shape having at least one sidewall. An etch blocking layer is formed over the sidewall during the anisotropic etching. The etch blocking layer is removed with an etchant comprising fluorine and a noble element.

In another aspect, the invention encompasses a method of forming a conductive line. A layer of conductive material is formed. A masking layer is formed over a portion of the layer of conductive material in the shape of a conductive line. The conductive material is anisotropically etched with the masking layer in place to form the conductive line beneath the masking layer. The conductive line has sidewalls. A blocking layer is formed over the sidewalls during the anisotropic etching. The blocking layer is removed using an ion enhanced plasma with an etchant comprising fluorine and a noble element.

BRIEF DESCRIPTION OF THE DRAWINGS

Preferred embodiments of the invention are described below with reference to the following accompanying drawings.

FIG. 7 is a diagrammatic, cross-sectional view of the FIG. 6 wafer fragment at a processing step subsequent to that of FIG. 6.

FIG. 8 is a diagrammatic, cross-sectional view of a wafer fragment at a processing step according to a second embodiment of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 6:
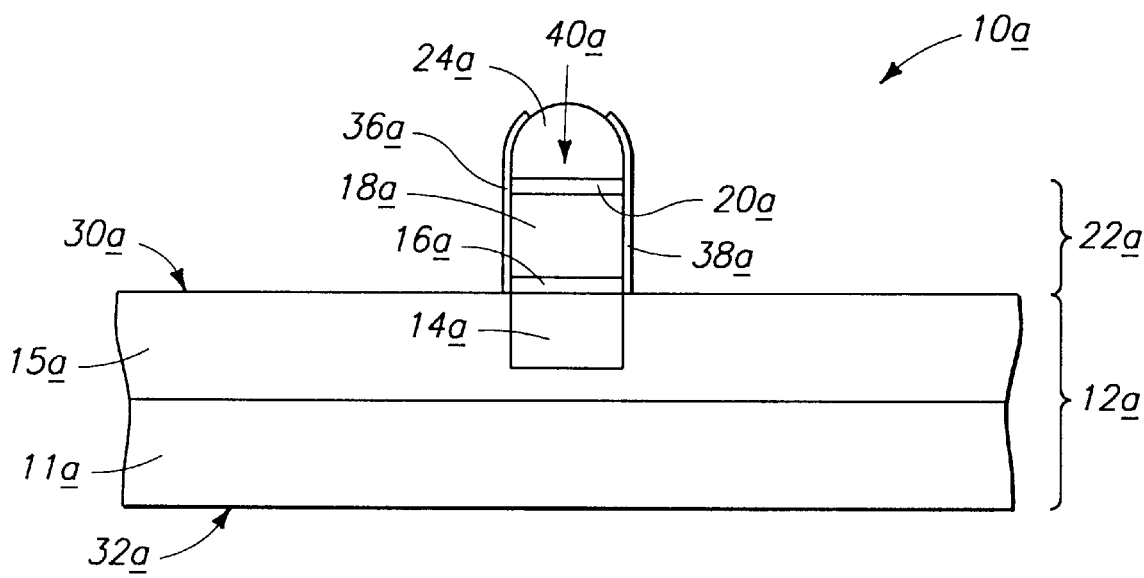
FIG. 6 is a diagrammatic, cross-sectional view of a wafer fragment processed according to a first embodiment of the present invention.

The present invention is described with reference to FIGS. 6–9. FIGS. 6 and 7 pertain to a first embodiment of the present invention, and FIGS. 8–9 pertain to a second embodiment.

Referring to FIGS. 6 and 7, similar numbering to that utilized in describing the prior art of FIGS. 1–5 will be used, with differences indicated by the suffix "a" or by different numerals. FIG. 6 shows a semiconductor wafer fragment 10a at the processing step described above with reference to FIG. 3. Wafer fragment 10a comprises a patterned masking layer 24a over an anisotropically etched conductive component 40a. Conductive component 40a is over a substrate 12a which comprises a backside surface 32a and a frontside surface 30a. Laterally adjacent conductive component 40a and patterned masking layer 24a are blocking layers 36a and 38a.

Referring to FIG. 7, blocking layers 36a (shown in FIG. 6) and 38a (shown in FIG. 6) have been removed. In accordance with the present invention, such blocking layers are removed with an etchant comprising fluorine and a noble element. The noble element preferably comprises one or more elements selected from the group consisting of He, Ar, Xe, and Kr. The fluorine preferably comprises one or more compounds selected from the group consisting of $C_2F_6$, $NF_3$, $CF_4$, and $SF_6$. In some applications, the etchant can consist essentially of one or more noble elements selected from the group consisting of He, Ar, Xe, and Kr, and one or more fluorine-containing compounds selected from the group consisting of $C_2F_6$, $NF_3$, $CF_4$, and $SF_6$. The ratio of the noble elements to the fluorine-containing compounds is ideally from about 2:1 to about 20:1. A more preferred ratio of the noble elements to the fluorine-containing gasses is about 10:1. The etchant can be in a form of a plasma, and is preferably comprised in an ion-enhanced plasma.

Figure 1:
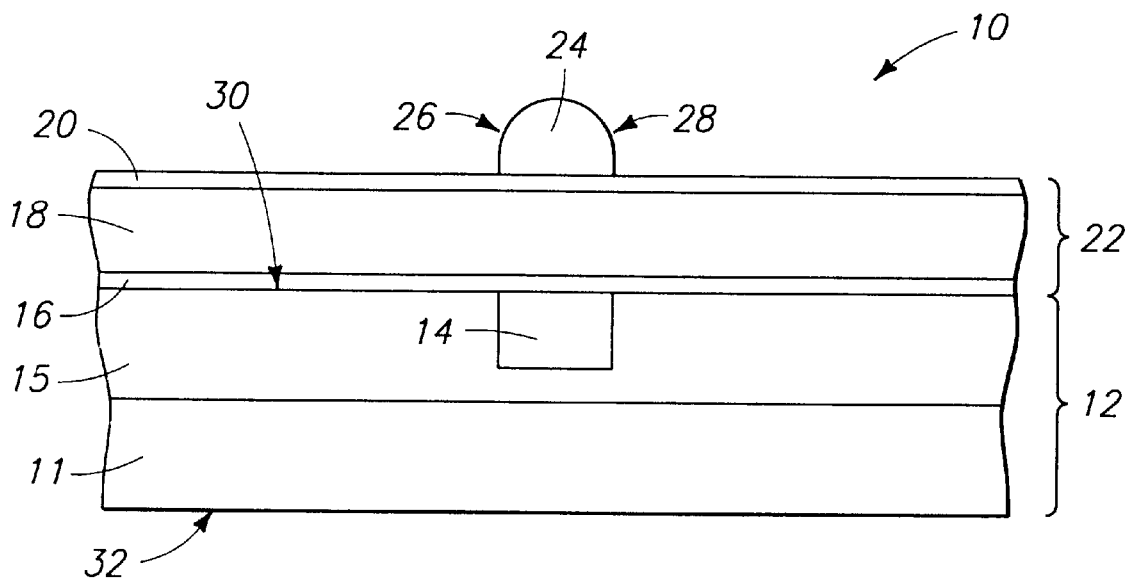
FIG. 1 is a diagrammatic, cross-sectional view of a semiconductor wafer fragment at a preliminary step of a prior art processing method.
Figure 2:
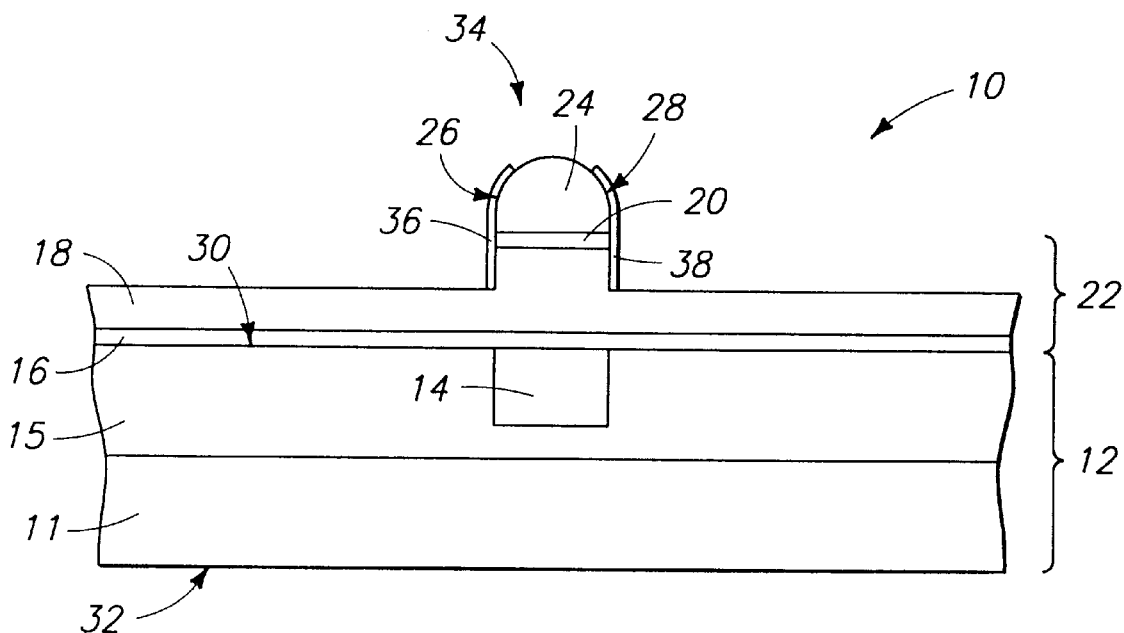
FIG. 2 is a diagrammatic, cross-sectional view of the FIG. 1 wafer fragment at a prior art processing step subsequent to that of FIG. 1.
Figure 3:
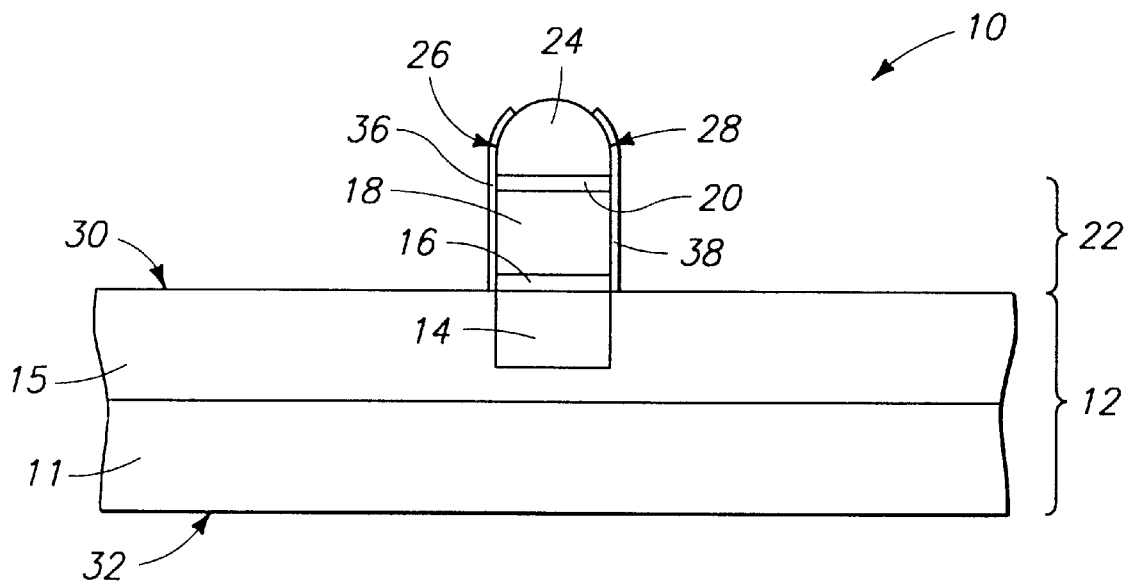
FIG. 3 is a diagrammatic, cross-sectional view of the FIG. 1 wafer fragment at a prior art processing step subsequent to that of FIG. 2.
Figure 4:
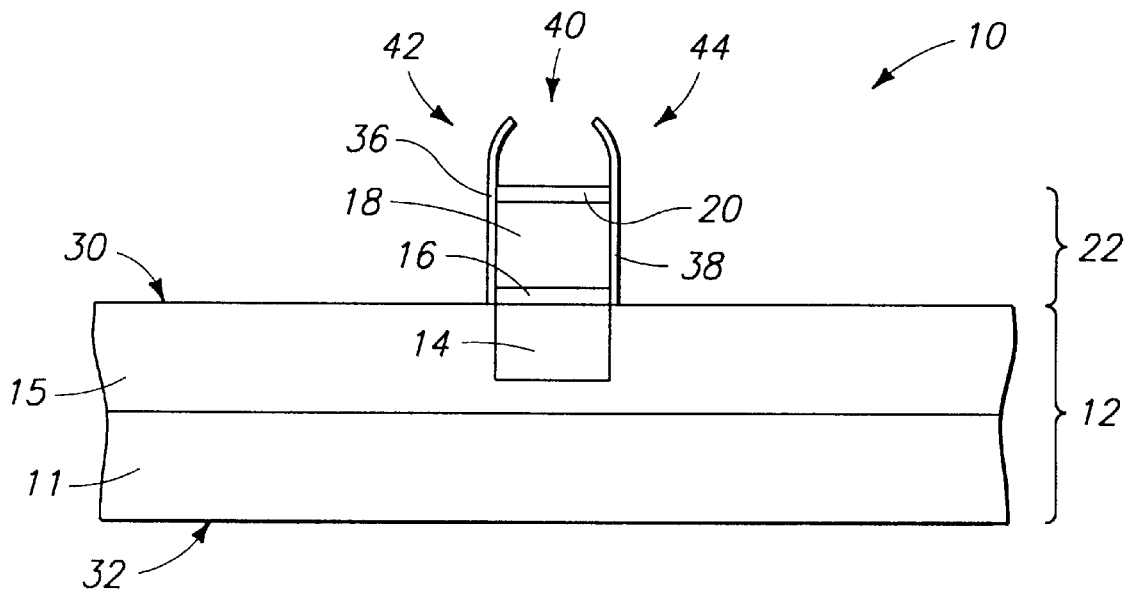
FIG. 4 is a diagrammatic, cross-sectional view of the FIG. 1 wafer fragment at a prior art processing step subsequent to that of FIG. 3.
Figure 5:
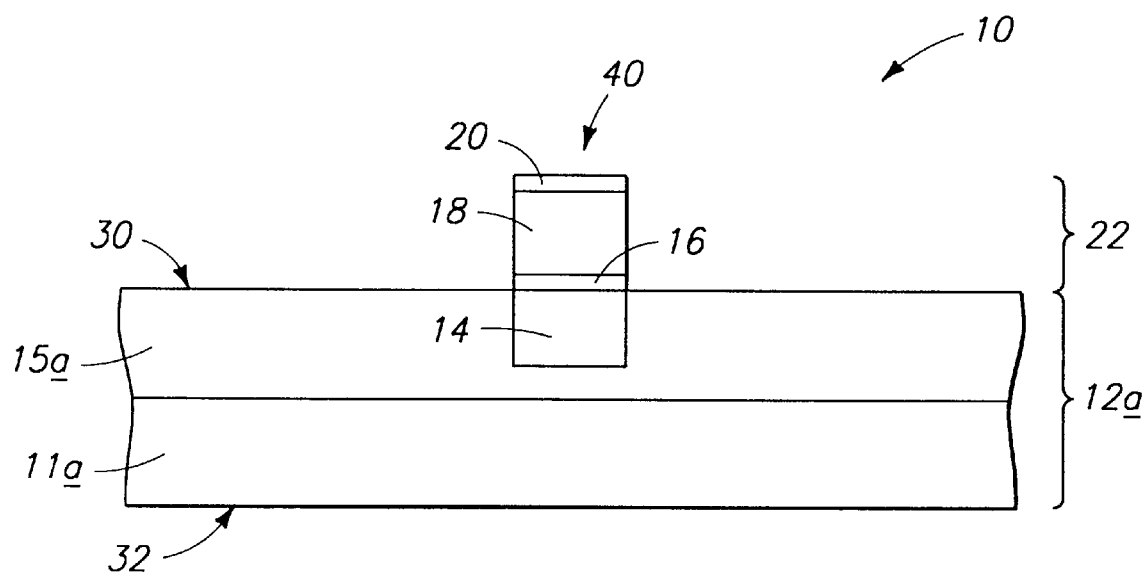
FIG. 5 is a diagrammatic, cross-sectional view of the FIG. 1 wafer fragment at a prior art processing step subsequent to that of FIG. 4.

Component 40a is formed from an anisotropic etch of a composite layer identical to layer 22 (shown in FIG. 1). Such anisotropic etch preferably occurs within a reactor and under a vacuum. The removal of blocking layers 36a (shown in FIG. 6) and 38a (shown in FIG. 6) preferably occurs in situ within the same reactor and without removing the vacuum after the anisotropic etching. Preferably, during removal of blocking layers 36a and 38a, backside surface 32a of wafer fragment 10a is biased from about 200 watts to about 500 watts relative to frontside surface 30a of wafer fragment 10a.

After removal of blocking layers 36a and 38a, photoresist layer 24a can be removed from over component 40a.

Figure 9:
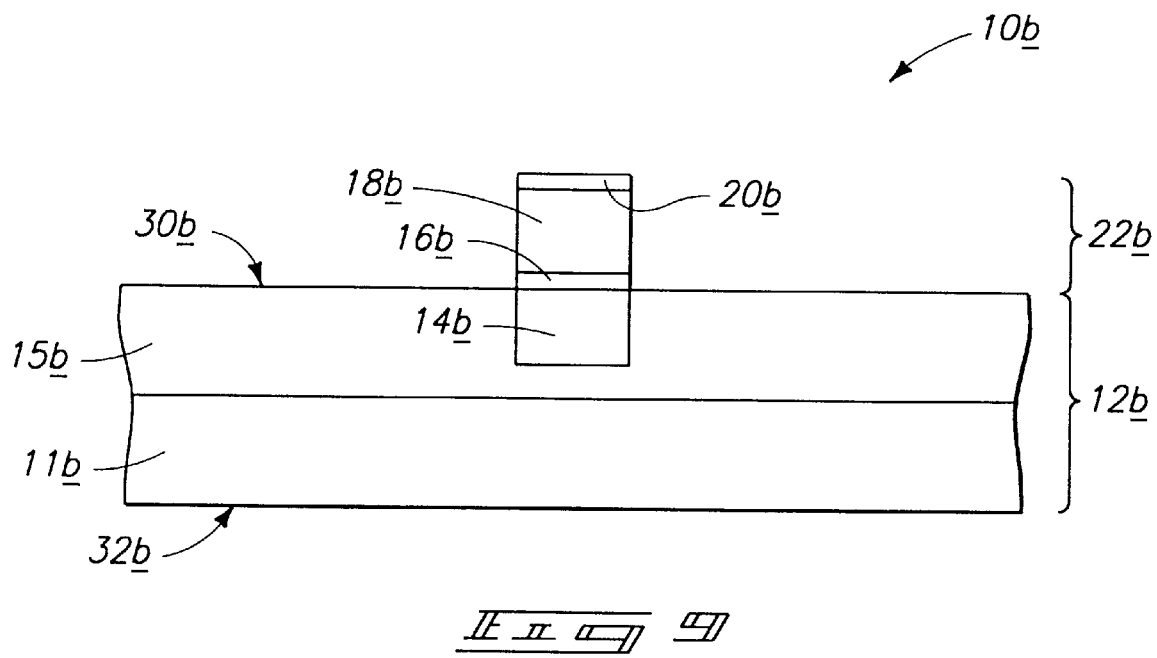
FIG. 9 is a diagrammatic, cross-sectional view of the FIG. 8 wafer fragment at a processing step subsequent to that of FIG. 8.

Referring next to the second embodiment invention of FIGS. 8 and 9, similar numbers to those utilized in describing the prior art of FIGS. 1–5 will be used, with differences indicated by the suffix "b" or by different numerals. FIG. 8 shows a semiconductor wafer fragment 10b at the processing step described above with reference to FIG. 4 of the prior art. Wafer fragment 10b comprises a conductive component 40b and blocking layers 36b and 38b laterally adjacent component 40b. Component 40b comprises a conductive material composite layer 22b including layers 20b, 18b and 16b. Blocking layers 36b and 38b comprise extensions 42b and 44b, respectively, extending above conductive component 40b.

Referring to FIG. 9, blocking layers 36b and 38b are removed with an etchant comprising fluorine and a noble element. Such etchant can comprise similar chemistry to that discussed above regarding the embodiment of FIGS. 6 and 7. Extensions 42b and 44b are removed with the rest of etch blocking layers 36b and 38b.

EXAMPLE

A semiconductor wafer fragment similar to that shown in FIG. 8 and comprising blocking layers adjacent a conductive component was subjected to an etch comprising argon and $NF_3$ under the following conditions. The wafer was maintained under a pressure of 10 mtorr to 50 mtorr and a temperature of from 35° C. to 75° C. A bias at the backside of the wafer relative to the frontside of the wafer was maintained to be approximately 250 watts in a LAM9600 reactor. Argon was flowed into the reactor chamber at 80 standard cubic centimeters (sccm) and $NF_3$ was flowed into the reactor chamber at 8 sccm. The blocking layers were removed after 20 seconds.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive component comprising:
   anisotropically etching a conductive material into a conductive component shape having at least one sidewall, and forming an etch blocking layer over the sidewall during the anisotropic etching;
   forming a photoresist masking layer over the conductive material before the anisotropically etching, the photoresist masking layer having a sidewall, the etch blocking layer comprising an extension along and on the sidewall of the photoresist masking layer;
   after the anisotropic etching, removing the photoresist masking layer to leave the extension of the etch blocking layer extending above the conductive component shape;

removing the etch blocking layer with an etchant comprising a fluorine-containing compound and a noble element; and removing the extension of the blocking layer while removing the etch blocking layer with the etchant.

2. The method of claim 1 wherein the anisotropic etching occurs within a reactor and wherein the removing the etch blocking layer occurs within the reactor.

3. The method of claim 1 wherein the anisotropic etching occurs within a reactor under a vacuum and wherein the removing the etch blocking layer occurs within the reactor without removing the vacuum after the anisotropic etching.

4. The method of claim 1 wherein the noble element comprises one or more elements selected from the group consisting of He, Ar, Xe and Kr.

5. The method of claim 1 wherein the fluorine-containing compound is selected from the group consisting of $C_2F_6$, $NF_3$, $CF_4$, $SF_6$, and mixtures thereof.

6. The method of claim 1 wherein the etchant consists essentially of one or more noble elements selected from the group consisting of He, Ar, Xe and Kr, and one or more fluorine-containing compounds selected from the group consisting of $C_2F_6$, $NF_3$, $CF_4$, and $SF_6$.

7. The method of claim 1 wherein the etchant comprises an ion enhanced plasma.

8. A method of forming a conductive line comprising:

forming a layer of conductive material;

forming a masking layer over a portion of the layer of conductive material in the shape of a conductive line the masking layer comprising a sidewall;

anisotropically etching the conductive material with the masking layer in place to form a conductive line beneath the masking layer, the conductive line having sidewalls, an etch blocking layer forming over the sidewalls during the anisotropic etching, the etch blocking layer comprising an extension along and against the sidewall of the masking layer;

after the anisotropic etching, removing the masking layer to leave the extension of the etch blocking layer extending above the conductive component shape; and removing the extension of the blocking layer while removing the etch blocking layer with an etchant comprising a fluorine-containing compound and a noble element.

9. The method of claim 8 wherein the etchant comprises an ion enhanced plasma.

10. The method of claim 8 wherein the noble element comprises one or more elements selected from the group consisting of He, Ar, Xe and Kr.

11. The method of claim 8 wherein the fluorine-containing compound is selected from the group consisting of $C_2F_6$, $NF_3$, $CF_4$, and $SF_6$.

12. The method of claim 8 wherein the noble element comprises one or more elements selected from the group consisting of He, Ar, Xe and Kr, and wherein the fluorine-containing compound is selected from the group consisting of $C_2F_6$, $NF_3$, $CF_4$, and $SF_6$.

13. The method of claim 8 wherein the etchant consists essentially of one or more noble elements selected from the group consisting of He, Ar, Xe and Kr, and one or more fluorine-containing compounds selected from the group consisting of $C_2F_6$, $NF_3$, $CF_4$, and $SF_6$.

14. The method of claim 8 wherein the noble element comprises Ar and wherein the fluorine is present as one or more compounds selected from the group consisting of $C_2F_6$, $NF_3$, $CF_4$, and $SF_6$.

15. The method of claim 8 wherein the etchant consists essentially of Ar and one or more fluorine-containing compounds selected from the group consisting of $C_2F_6$, $NF_3$, $CF_4$, and $SF_6$.

16. The method of claim 8 wherein the etchant consists essentially of Ar and one or more fluorine-containing compounds selected from the group consisting of $C_2F_6$, $NF_3$, $CF_4$, and $SF_6$; and wherein the ratio of Ar to the fluorine-containing compounds is from about 2:1 to about 20:1.

17. The method of claim 8 wherein the etchant consists essentially of Ar and $C_2F_6$.

18. The method of claim 8 wherein the etchant consists essentially of Ar and $NF_3$.

19. The method of claim 8 wherein the etchant consists essentially of Ar and $CF_4$.

20. The method of claim 8 wherein the etchant consists essentially of Ar and $SF_6$.

21. A method of forming a conductive line comprising:

forming a layer of titanium over a substrate;

forming a layer of aluminum-copper alloy over the layer of titanium;

forming a layer of titanium nitride over the layer of aluminum-copper alloy;

forming a photoresist masking layer over a portion of the layer of titanium nitride in the shape of a conductive line, the photoresist masking layer having sidewalls;

anisotropically etching the layers of titanium nitride, aluminum-copper alloy and titanium with the masking layer in place to form a conductive line beneath the masking layer, the conductive line having sidewalls comprising titanium, aluminum-copper alloy and titanium nitride; a blocking layer forming over the conductive line sidewalls and on the photoresist sidewalls during the anisotropic etching;

after the anisotropic etching, removing the photoresist masking layer to leave an extension of the etch blocking layer extending above the conductive line; and removing the blocking layer and the extension of the blocking layer with an etchant comprising an ion enhanced plasma including a fluorine-containing compound and a noble element.

22. The method of claim 21 wherein the noble element comprises one or more elements selected from the group consisting of He, Ar, Xe and Kr.

23. The method of claim 21 wherein the fluorine-containing compound is selected from the group consisting of $C_2F_6$, $NF_3$, $CF_4$, and $SF_6$.

24. The method of claim 21 wherein the noble element comprises one or more elements selected from the group consisting of He, Ar, Xe and Kr, and wherein the fluorine-containing compound is selected from the group consisting of $C_2F_6$, $NF_3$, $CF_4$, and $SF_6$.

25. The method of claim 21 wherein the etchant consists essentially of one or more noble elements selected from the group consisting of He, Ar, Xe and Kr, and one or more fluorine-containing compounds selected from the group consisting of $C_2F_6$, $NF_3$, $CF_4$, and $SF_6$.

26. The method of claim 21 wherein the blocking layer comprises organic and inorganic materials.

27. The method of claim 21 wherein the blocking layer forms over the titanium, aluminum-copper alloy and titanium nitride of the sidewalls and is removed from over the titanium, aluminum-copper alloy and titanium nitride.

* * * * *